United States Patent
Chen et al.

(10) Patent No.: US 10,376,054 B1
(45) Date of Patent: Aug. 13, 2019

(54) SLIDE RAIL ASSEMBLY AND RACK SYSTEM

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chih-Hsin Yeh, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 0 days.

(21) Appl. No.: 16/134,088

(22) Filed: Sep. 18, 2018

(30) Foreign Application Priority Data

Apr. 2, 2018 (TW) .............................. 107112013 A

(51) Int. Cl.
*A47B 88/403* (2017.01)
*H05K 7/14* (2006.01)

(52) U.S. Cl.
CPC .... *A47B 88/403* (2017.01); *A47B 2210/0081* (2013.01); *H05K 7/1489* (2013.01)

(58) Field of Classification Search
CPC .......... A47B 88/403; A47B 2210/0081; H05K 7/1489
See application file for complete search history.

(56) References Cited

U.S. PATENT DOCUMENTS

| | | | | |
|---|---|---|---|---|
| 2,914,370 | A * | 11/1959 | Hensch | A47B 88/493 312/286 |
| 4,183,596 | A * | 1/1980 | Greene | A47B 88/493 312/286 |
| 5,851,059 | A * | 12/1998 | Cirocco | A47B 88/493 312/334.11 |
| 5,871,265 | A | 2/1999 | Stewart et al. | |
| 6,074,000 | A * | 6/2000 | Wagner | A47C 7/62 297/188.08 |
| 2011/0011817 | A1* | 1/2011 | Yamakawa | A47B 67/04 211/153 |
| 2014/0044382 | A1* | 2/2014 | Chen | A47B 88/493 384/21 |
| 2014/0265793 | A1 | 9/2014 | Evans et al. | |
| 2015/0123528 | A1* | 5/2015 | Wu | H05K 5/0217 312/319.1 |
| 2016/0227666 | A1* | 8/2016 | Chen | H05K 7/1489 |
| 2016/0262538 | A1* | 9/2016 | Chen | H05K 7/1489 |
| 2016/0262540 | A1* | 9/2016 | Chen | H05K 7/1489 |
| 2017/0082143 | A1* | 3/2017 | Chen | F16C 29/12 |
| 2017/0360198 | A1* | 12/2017 | Chen | A47B 88/43 |

* cited by examiner

*Primary Examiner* — Hanh V Tran
(74) *Attorney, Agent, or Firm* — Rosenberg, Klein & Lee

(57) ABSTRACT

A slide rail assembly includes a first rail, a second rail, and a blocking member. The blocking member is arranged adjacent to the rear end of the first rail and can be operated so as to enter or exit a blocking state. The blocking member in the blocking state serves to block the rear end of the second rail. When the blocking member is not in the blocking state, and the second rail reaches a rearwardly extended position after displacement with respect to the first rail, the rear end of the second rail extends beyond the rear end of the first rail.

20 Claims, 10 Drawing Sheets

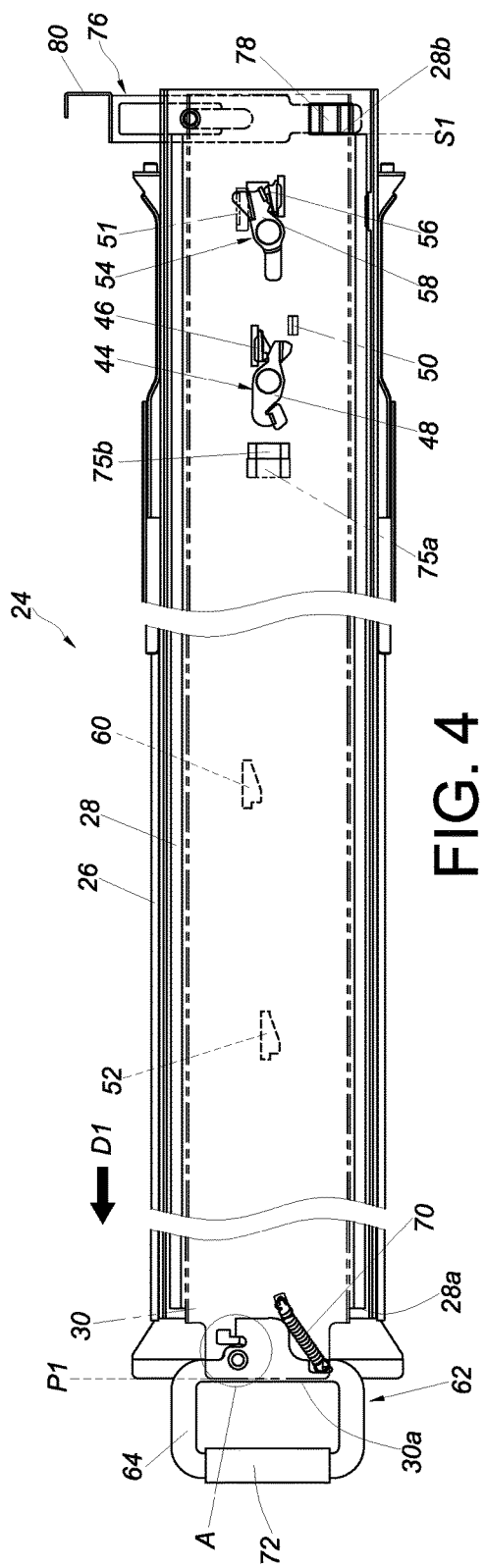
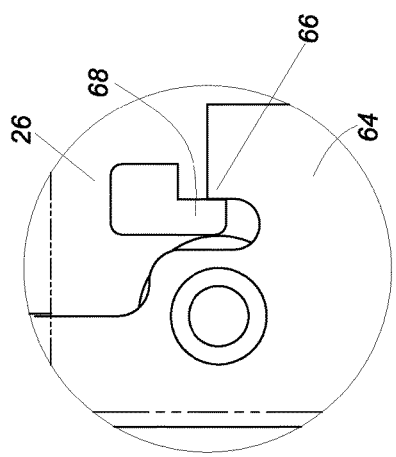
FIG. 4
FIG. 5

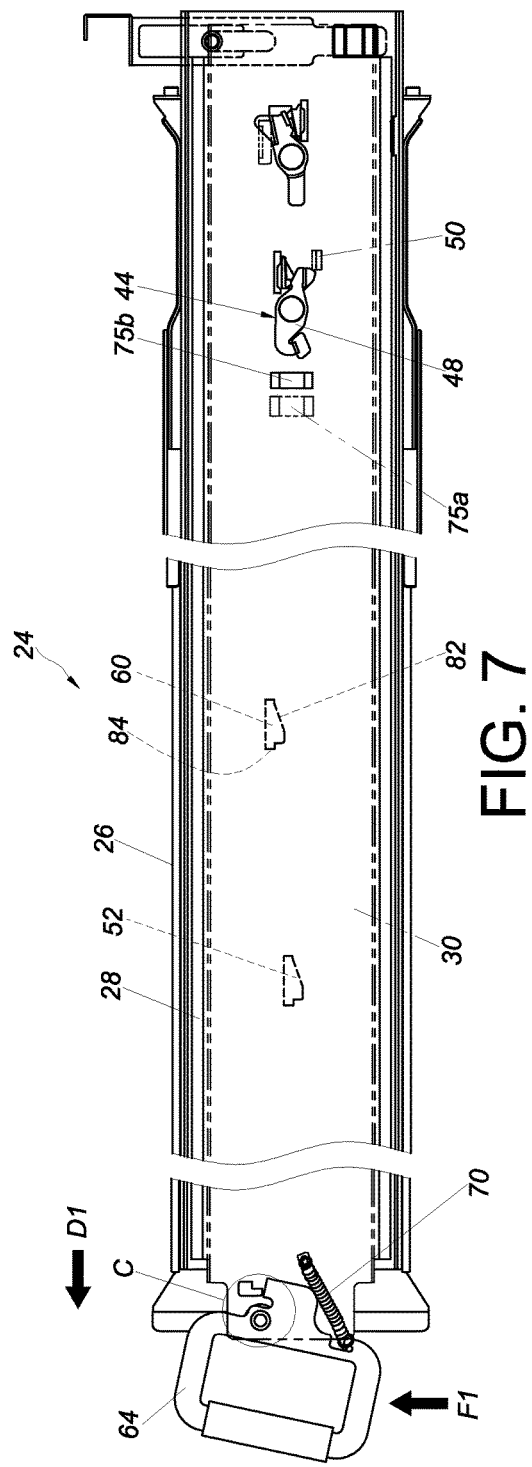
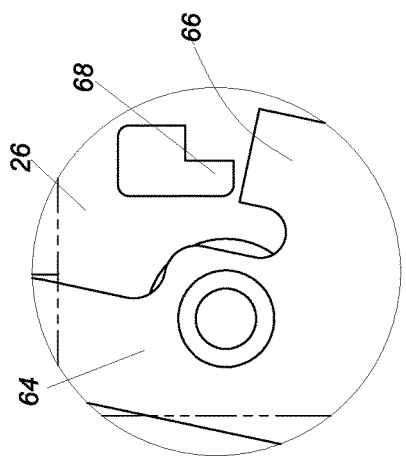
FIG. 7
FIG. 8

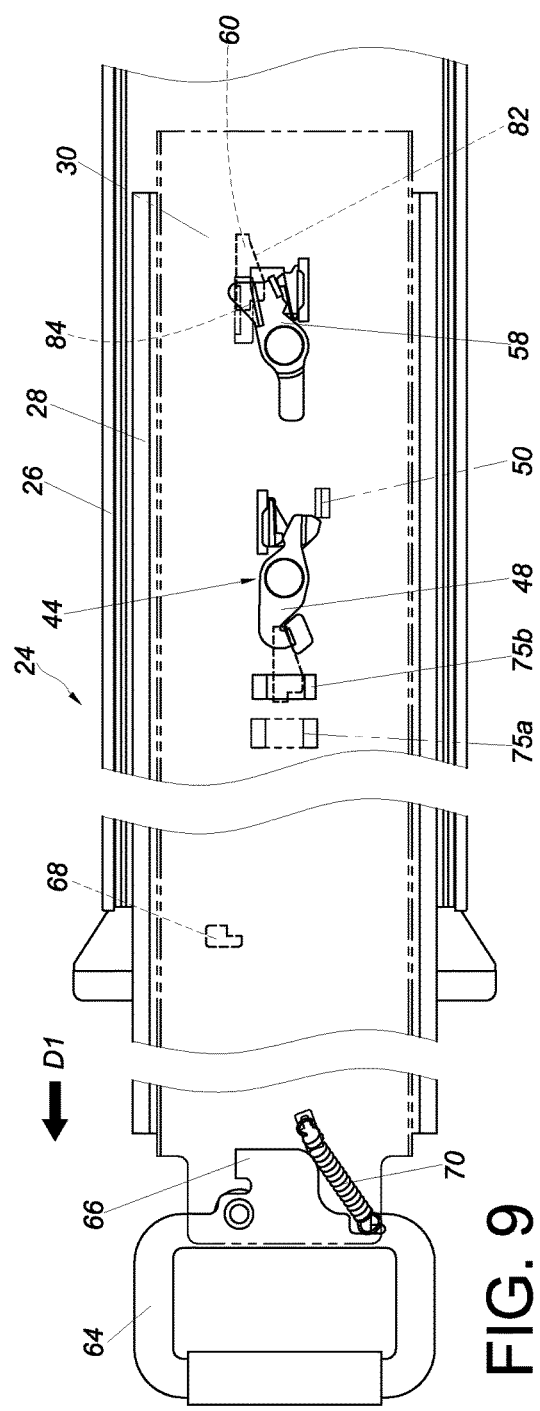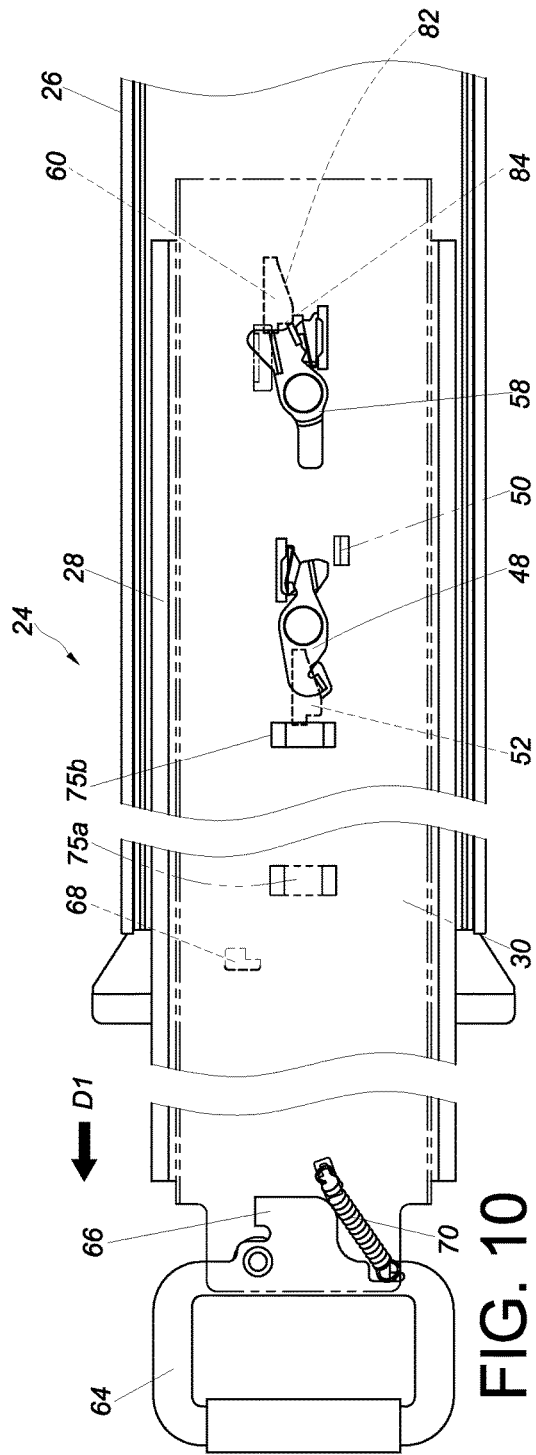

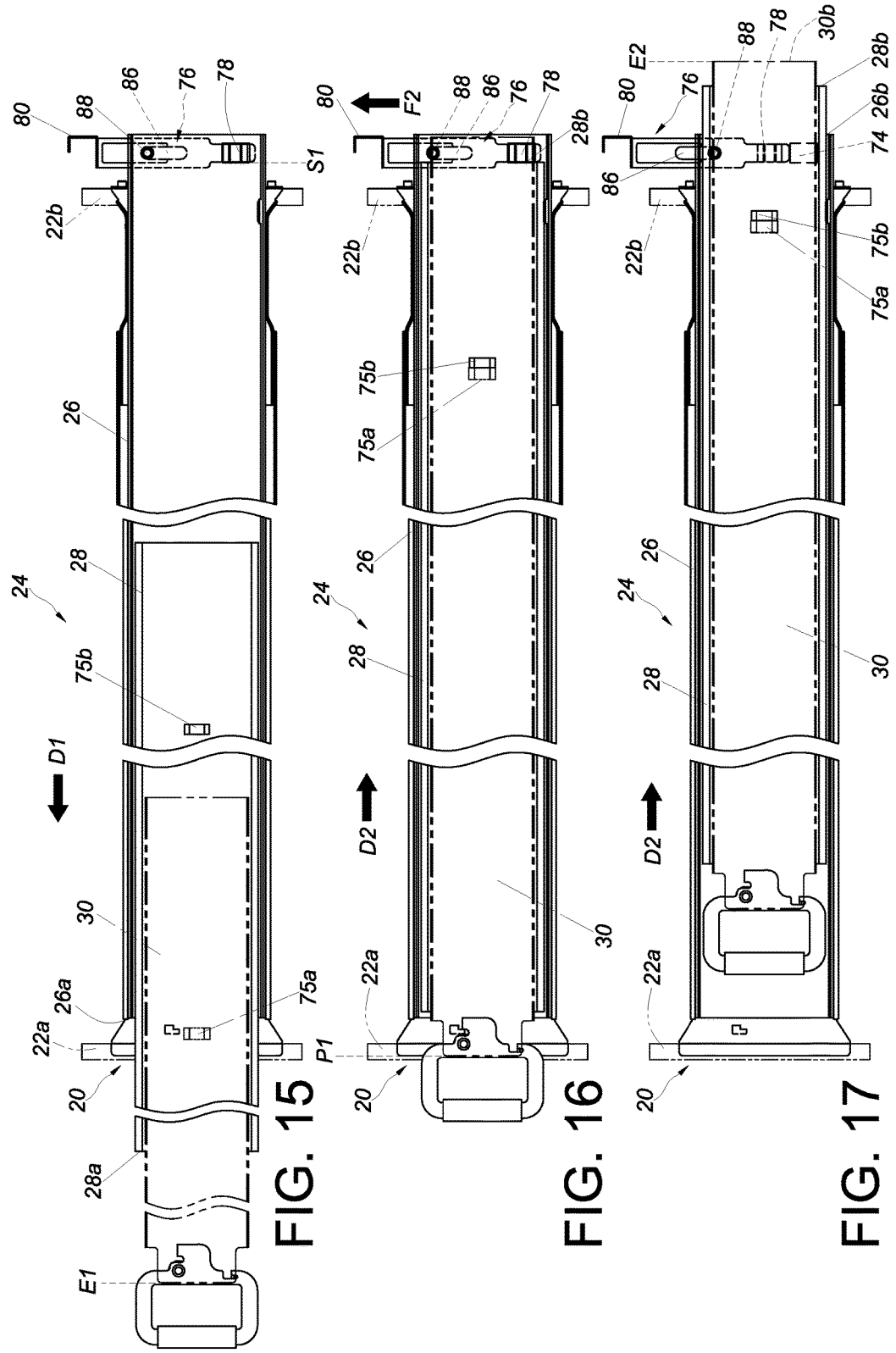

SLIDE RAIL ASSEMBLY AND RACK SYSTEM

FIELD OF THE INVENTION

The present invention relates to a slide rail assembly and more particularly to one adjustable for displacement in two directions.

BACKGROUND OF THE INVENTION

Evans et al. disclose a bidirectional slide rail in US Patent Application Publication No. 2014/0265793 A1. This slide rail, however, cannot be extended beyond the rear end of a rack as well as in a forward direction of the rack once mounted at a fixed position on the rack. In practical use, therefore, the slide rail still leaves room for improvement.

SUMMARY OF THE INVENTION

The present invention relates to a slide rail assembly that can be adjusted for bidirectional displacement.

According to one aspect of the present invention, a slide rail assembly includes a first rail, a second rail, and a blocking member. When the second rail reaches a forwardly extended position after being displaced with respect to the first rail in a first direction, the front end of the second rail extends beyond the front end of the first rail. The blocking member is arranged adjacent to the rear end of the first rail and can be operated so as to enter or exit a blocking state. When the blocking member is in the blocking state, and the second rail reaches a retracted position after being displaced from the forwardly extended position with respect to the first rail in a second direction, the rear end of the second rail is blocked by the blocking member. Once the blocking member is operated and thus exits the blocking state, the second rail can be displaced from the retracted position to a rearwardly extended position with respect to the first rail in the second direction such that the rear end of the second rail extends beyond the rear end of the first rail.

Preferably, the slide rail assembly further includes a third rail movably connected to the second rail to increase the extension length of the slide rail assembly.

Preferably, the first rail includes an upper wall, a lower wall, and a sidewall extending between the upper wall and the lower wall; and the upper wall, the lower wall, and the sidewall of the first rail jointly define a first channel for receiving the second rail.

Preferably, the second rail includes an upper wall, a lower wall, and a sidewall extending between the upper wall and the lower wall; and the upper wall, the lower wall, and the sidewall of the second rail jointly define a second channel for receiving the third rail.

Preferably, the slide rail assembly further includes a simultaneous displacement mechanism. The simultaneous displacement mechanism includes a first elastic element, a first moving element, and an engaging element. The first moving element is arranged on the second rail and is at an initial position in response to the first elastic element generating an elastic force. The engaging element is arranged on the third rail and corresponds to a portion of the first moving element. When the third rail is displaced from the retracted position with respect to the first rail in the first direction, the first moving element on the second rail and the engaging element on the third rail abut against each other so that the second rail and the third rail can be displaced simultaneously.

Preferably, the first rail includes a first feature corresponding to another portion of the first moving element of the simultaneous displacement mechanism. When the third rail reaches a predetermined position after being displaced with respect to the first rail in the first direction, the first moving element is guided, and thus displaced, by the first feature; as a result, the first moving element on the second rail and the engaging element on the third rail no longer abut against each other.

Preferably, the slide rail assembly further includes a rear positioning mechanism. The rear positioning mechanism includes a second elastic element, a second moving element, and a second feature. The second moving element is arranged on the second rail and is at an initial position in response to the second elastic element generating an elastic force. The second feature is arranged on the first rail, corresponds to a portion of the second moving element, and has a guiding portion and a blocking wall. When the second rail reaches a predetermined position after being displaced from the retracted position with respect to the first rail in the first direction, the second moving element is guided, and thus tilted by an angle, by the guiding portion and ends up abutting against the blocking wall; consequently, the second rail cannot be freely displaced with respect to the first rail in the second direction.

Preferably, the third rail includes a releasing member corresponding to another portion of the second moving element. When the third rail reaches a predetermined position after being displaced with respect to the first rail in the second direction, the second moving element is guided, and thus displaced, by the releasing member and hence no longer abuts against the blocking wall.

Preferably, a first projection is arranged on the third rail, and a second projection is arranged on the second rail and corresponds to the first projection. The first projection and the second projection abut against each other when the third rail reaches a predetermined position after being displaced with respect to the second rail in the second direction.

Preferably, the first rail has a hole adjacent to its rear end, and the blocking member includes a blocking portion. The blocking portion of the blocking member can be operated so as to be located in or outside the hole of the first rail. When located in the hole of the first rail, the blocking portion serves to block the rear end of the second rail.

Preferably, the blocking member has an operating arm connected to the blocking portion.

Preferably, the slide rail assembly further includes a front positioning mechanism.

The front positioning mechanism includes an operating member having a first blocking section and also includes a second blocking section provided on the first rail. The operating member is movably arranged adjacent to the front end of the third rail. When the third rail is at the retracted position with respect to the first rail, the first blocking section of the operating member and the second blocking section on the first rail abut against each other, making it impossible to displace the third rail with respect to the first rail in the first direction. Once the operating member is so operated and displaced that the first blocking section of the operating member and the second blocking section on the first rail no longer abut against each other, the third rail can be displaced with respect to the first rail in the first direction.

Preferably, the slide rail assembly further includes a connecting spring for applying an elastic force to the operating member. The operating member stays at an initial position in response to the elastic force of the connecting spring so that, when the third rail is at the retracted position with respect to the first rail, the first blocking section and the second blocking section keep abutting against each other.

Preferably, the operating member is pivotally connected to the third rail.

Preferably, the operating member has a handle extending beyond the front end of the second rail.

According to another aspect of the present invention, a rack system includes a rack and a slide rail assembly according to any of aforesaid embodiments. The rack includes a front post and a rear post. The slide rail assembly is mountable on the front post and the rear post of the rack, such that the front end of the second rail extends beyond the front post of the rack when the second rail reaches a forwardly extended position with respect to the first rail, and that the rear end of the second rail extends beyond the rear post of the rack when the second rail reaches a rearwardly extended position with respect to the first rail.

BRIEF DESCRIPTION OF THE DRAWINGS

FIG. 4 is a schematic view of the slide rail assembly according to an embodiment of the present invention, showing in particular the arrangement of components;

FIG. 5 is an enlarged view of the circled area A in FIG. 4;

FIG. 6 is an enlarged view of the circled area B in FIG. 3;

FIG. 7 is a schematic view of the slide rail assembly according to an embodiment of the present invention, showing that the front positioning mechanism is operated, or released;

FIG. 8 is an enlarged view of the circled area C in FIG. 7;

FIG. 9 is a schematic view of the slide rail assembly according to an embodiment of the present invention, showing that the slide rail assembly is extended forward to a first extended position;

FIG. 10 is a schematic view of the slide rail assembly according to an embodiment of the present invention, showing that the slide rail assembly is extended forward to a second extended position;

FIG. 15 is a schematic view of the slide rail assembly according to an embodiment of the present invention, showing the slide rail assembly mounted on the rack and extended to a forwardly extended position after forward displacement;

FIG. 16 a schematic view of the slide rail assembly according to an embodiment of the present invention, showing the slide rail assembly mounted on the rack and retracted to a retracted position; and FIG. 17 is a schematic view of the slide rail assembly according to an embodiment of the present invention, showing the slide rail assembly mounted on the rack and extended to a rearwardly extended position.

DETAILED DESCRIPTION OF THE INVENTION

Figure 1:
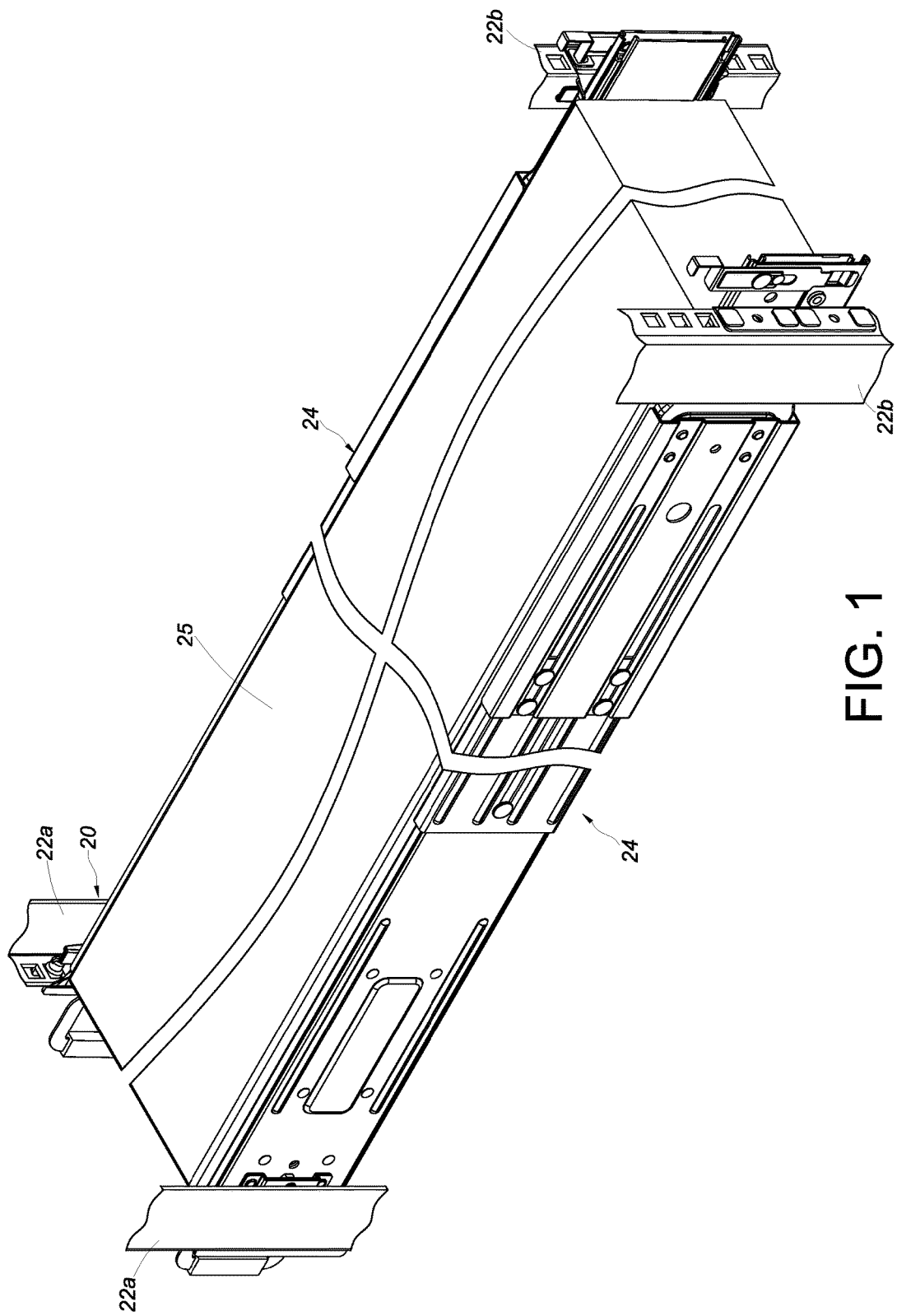
FIG. 1 is a perspective view of the rack system according to an embodiment of the present invention.

Referring to FIG. 1, the rack system according to one embodiment of the present invention includes a rack 20. The rack 20 includes a pair of front posts 22a and a pair of rear posts 22b. A pair of slide rail assemblies 24 are each mounted between the corresponding front post 22a and the corresponding rear post 22b of the rack 20 and are configured to carry an object 25, such as a piece of electronic equipment.

Figure 2:
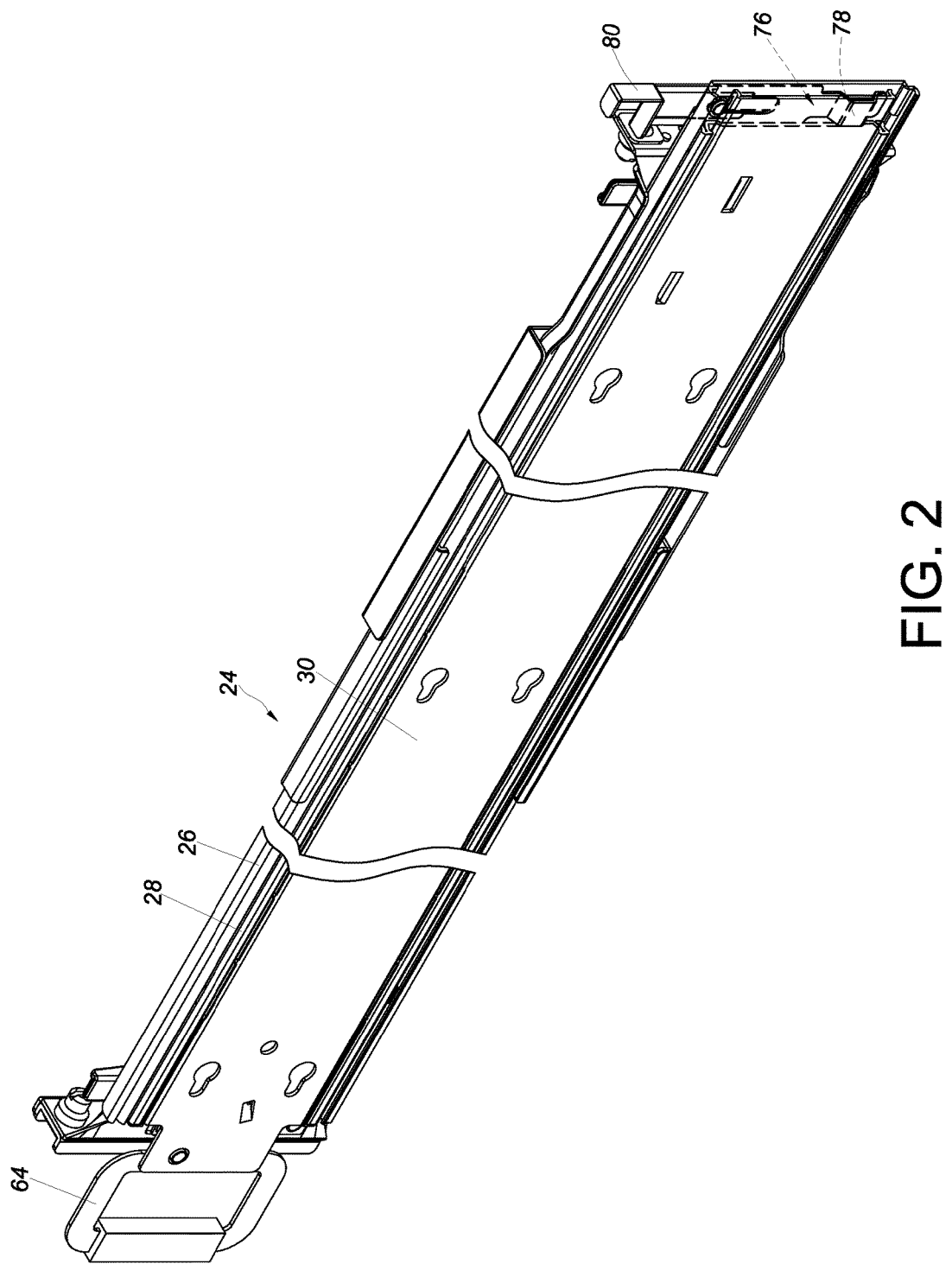
FIG. 2 is a perspective view of the slide rail assembly according to an embodiment of the present invention.
Figure 3:
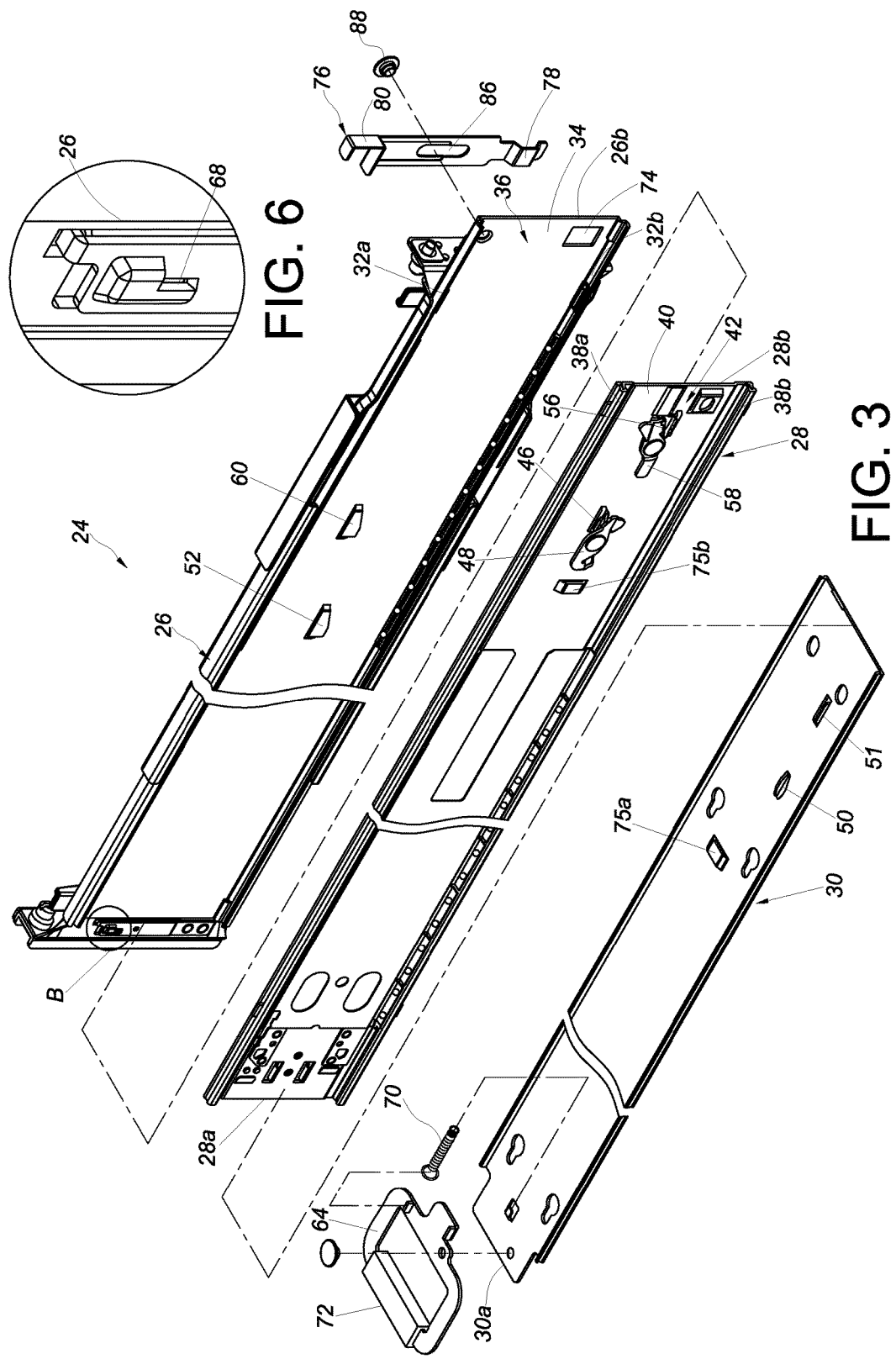
FIG. 3 is an exploded perspective view of the slide rail assembly according to an embodiment of the present invention.
Figure 11:
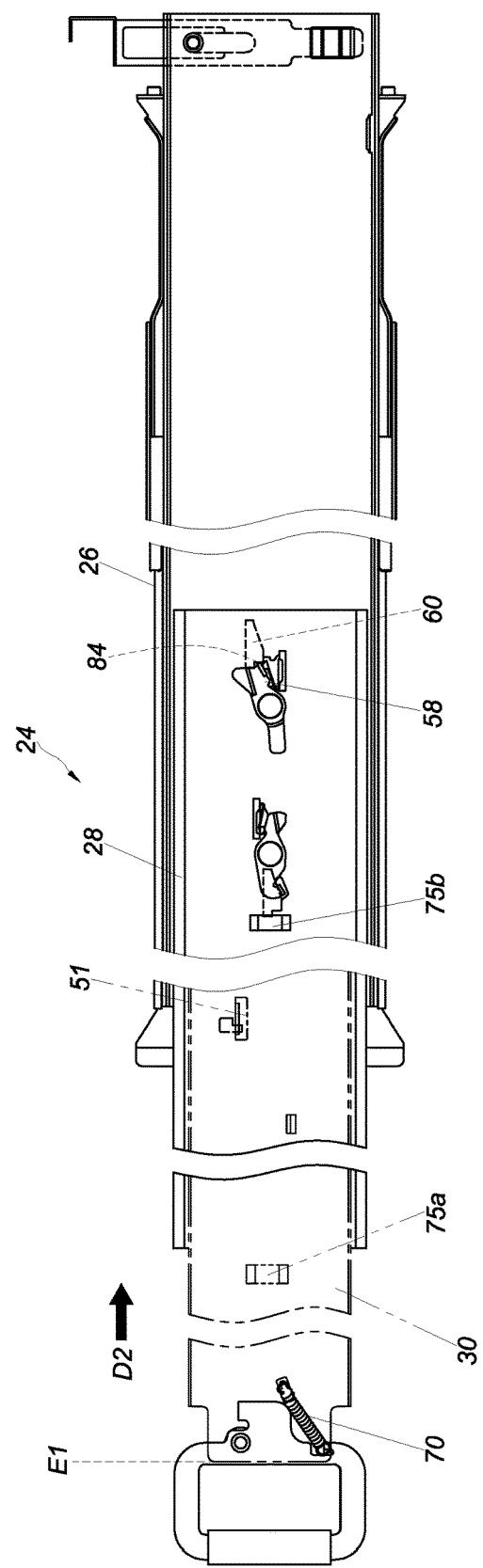
FIG. 11 is a schematic view of the slide rail assembly according to an embodiment of the present invention, showing the slide rail assembly at a first position after displacement from an extended position toward a retracted position.
Figure 12:
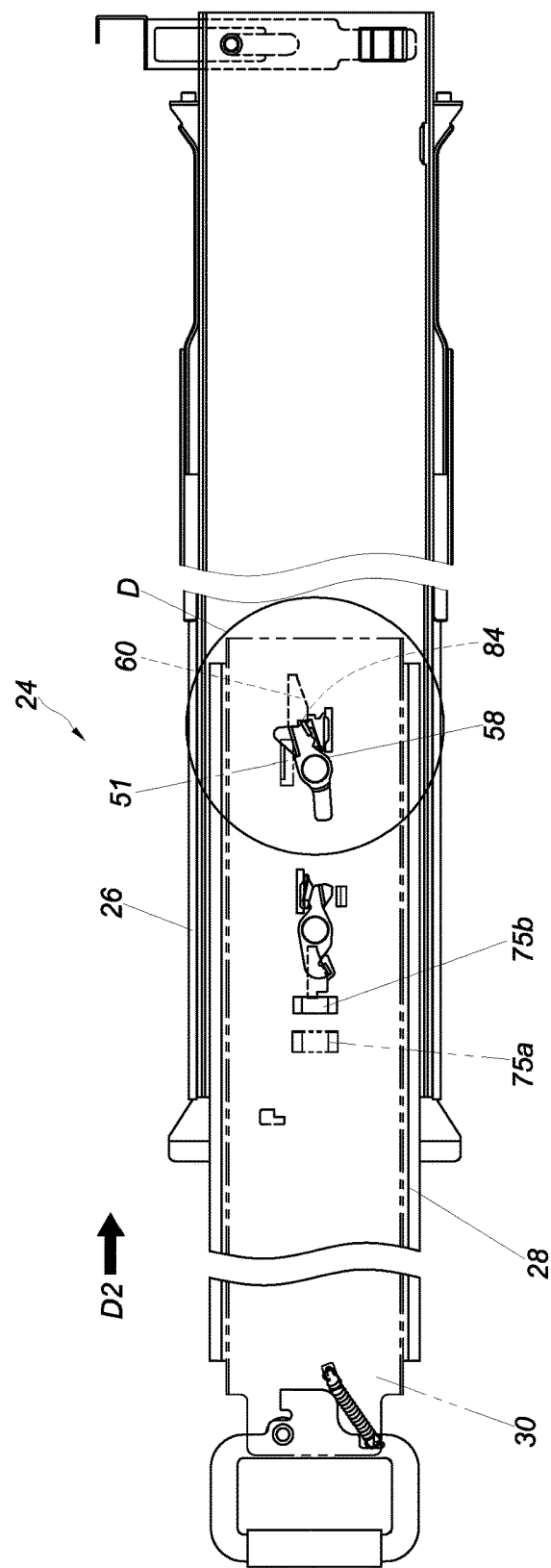
FIG. 12 is a schematic view of the slide rail assembly according to an embodiment of the present invention, showing that the slide rail assembly at a second position after displacement from the extended position toward the retracted position.
Figure 13:
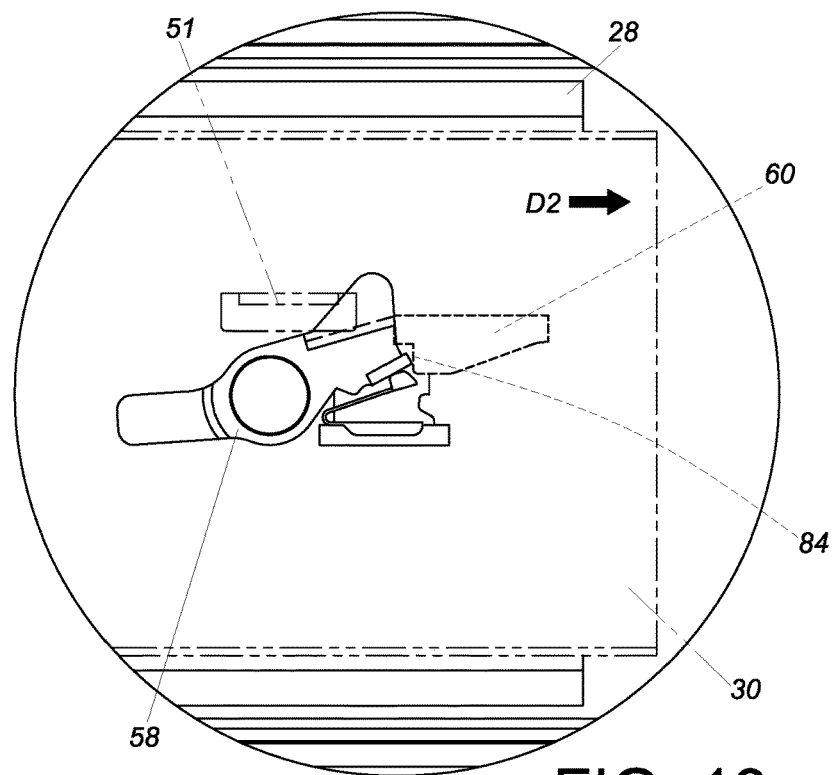
FIG. 13 is an enlarged view of the circled area D in FIG. 12.
Figure 14:
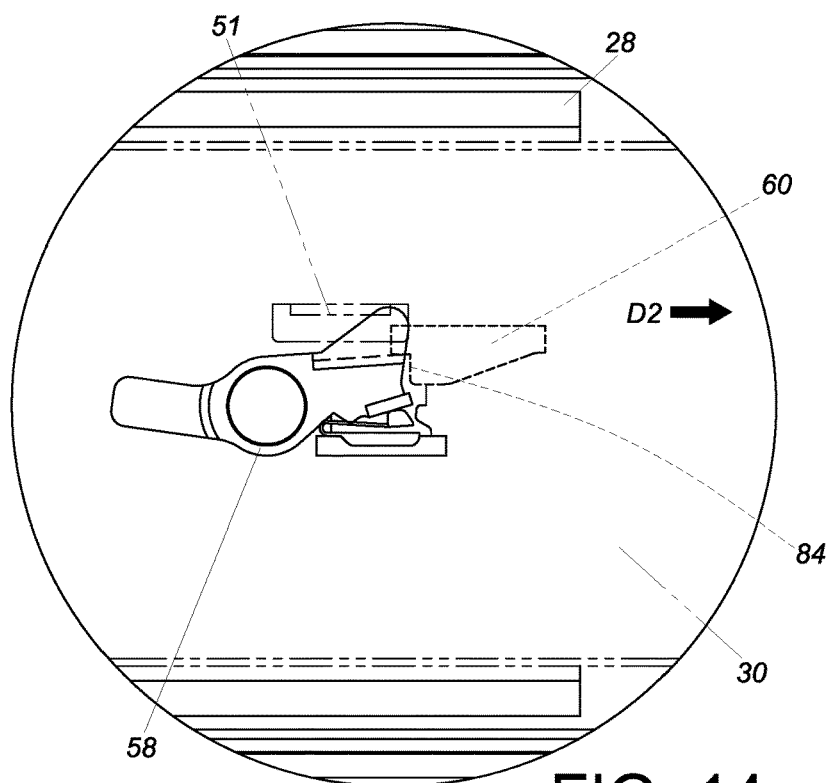
FIG. 14 is a schematic view showing that the second moving element and the second feature of the slide rail assembly according to an embodiment of the present invention no longer abut against each other.

Referring to FIG. 2 and FIG. 3, the slide rail assembly 24 includes a first rail 26, a second rail 28, and a third rail 30. The first rail 26 includes an upper wall 32a, a lower wall 32b, and a sidewall 34 extending between the upper wall 32a and the lower wall 32b. The upper wall 32a, the lower wall 32b, and the sidewall 34 jointly define a first channel 36 for receiving the second rail 28.

Similarly, the second rail 28 includes an upper wall 38a, a lower wall 38b, and a sidewall 40 extending between the upper wall 38a and the lower wall 38b. The upper wall 38a, the lower wall 38b, and the sidewall 40 jointly define a second channel 42 for receiving the third rail 30. The third rail 30 is provided to increase the extension length of the slide rail assembly 24.

Referring to FIG. 4, the slide rail assembly 24 further includes a simultaneous displacement mechanism 44. The simultaneous displacement mechanism 44 includes a first elastic element 46, a first moving element 48, and an engaging element 50. The first moving element 48 is arranged on the second rail 28 and is at an initial position in response to an elastic force generated by the first elastic element 46. The engaging element 50 is arranged on the third rail 30 and corresponds to a portion of the first moving element 48. Preferably, the first moving element 48 is movably (e.g., pivotally) connected to the second rail 28. The first rail 26 includes a first feature 52 corresponding to another portion of the first moving element 48 of the simultaneous displacement mechanism 44.

The slide rail assembly 24 further includes a rear positioning mechanism 54. The rear positioning mechanism 54 includes a second elastic element 56, a second moving element 58, and a second feature 60. The second moving element 58 is arranged on the second rail 28 and is at an initial position in response to an elastic force generated by the second elastic element 56. The second feature 60 is arranged on the first rail 26 and corresponds to a portion of the second moving element 58. Preferably, the second moving element 58 is movably (e.g., pivotally) connected to the second rail 28. The third rail 30 includes a releasing member 51 corresponding to another portion of the second moving element 58.

The slide rail assembly 24 further includes a front positioning mechanism 62. Referring to FIG. 5 and FIG. 6, the front positioning mechanism 62 includes an operating member 64 with a first blocking section 66, and a second blocking section 68. The first blocking section 66 is provided on the operating member 64. The second blocking section 68 may be provided, for example, on the first rail 26 or the corresponding front post 22a. The second blocking section 68 may protrude with respect to the sidewall 34 of the first rail 26 and correspond to the first blocking section 66. The operating member 64 is movably arranged adjacent to the front end 30a of the third rail 30; for example, the operating member 64 is pivotally provided on the third rail 30 via a pivotal connection element, such as a rivet. When the third rail 30 is at a retracted position P1 with respect to the first rail 26, the first blocking section 66 of the operating member 64 abuts against the second blocking section 68 on the first rail 26 such that the third rail 30 cannot be displaced with respect to the first rail 26 in a first direction D1. Preferably, a connecting spring 70 is additionally provided to apply an elastic force to the operating member 64. Here, by way of example, the connecting spring 70 is a tension spring and has its two ends connected respectively to the operating member 64 and the third rail 30. In practice, the connecting spring 70 may be another type of spring, such as a torsion spring. The operating member 64 stays at an initial position in response to the elastic force of the connecting spring 70 so that, when the third rail 30 is at the retracted position P1 with respect to the first rail 26, the first blocking section 66 and the second blocking section 68 keep abutting against each other. Preferably, the operating member 64 is movably (e.g., pivotally) connected to the third rail 30. The operating member 64 includes a handle 72, which extends beyond the front end 28a of the second rail 28.

Besides, a first projection 75a is arranged on the third rail 30 of the slide rail assembly 24, and a second projection 75b is arranged on the second rail 28 and corresponds to the first projection 75a. The first projection 75a and the second projection 75b abut against each other when they are at predetermined relative positions. For example, in the course in which the third rail 30 is displaced, or retracted, with respect to the second rail 28 in a second direction D2 (which is the opposite direction of the first direction D1), the first projection 75a and the second projection 75b abut against each to facilitate retraction of the second rail 28 with respect to the first rail 26.

As shown in FIG. 3 and FIG. 4, the slide rail assembly 24 has a hole 74 in, and adjacent to the rear end 26b of, the first rail 26 and a blocking member 76 arranged adjacent to the rear end 26b of the first rail 26 (e.g., mounted on the first rail 26 or the corresponding rear post 22b). The blocking member 76 includes a blocking portion 78. The blocking portion 78 of the blocking member 76 corresponds to the rear end 28b of the second rail 28. For example, the blocking portion 78 can be operated in order to be located in the hole 74 of the first rail 26, to protrude with respect to the sidewall 34 of the first rail 26, and to thereby block the rear end 28b of the second rail 28. Preferably, the blocking member 76 has an operating arm 80 connected to the blocking portion 78.

Referring to FIG. 7 to FIG. 10, when the operating member 64 is operated, and thus displaced, by a force F1 such that the first blocking section 66 of the operating member 64 and the second blocking section 68 on the first rail 26 no longer abut against each other, the third rail 30 can be displaced with respect to the first rail 26 in the first direction D1. When the third rail 30 is displaced from the retracted position P1 with respect to the first rail 26 in the first direction D1, the first moving element 48 on the second rail 28 and the engaging element 50 on the third rail 30 abut against each other so that the second rail 28 and the third rail 30 can be displaced simultaneously. When the third rail 30 reaches a predetermined position after being displaced with respect to the first rail 26 in the first direction D1, the first moving element 48 is guided, and thus displaced, by the first feature 52 of the first rail 26; as a result, the first moving element 48 on the second rail 28 and the engaging element 50 on the third rail 30 no longer abut against each other, as shown in FIG. 10. The third rail 30 can now be further displaced with respect to the second rail 28 in the first direction D1.

On the other hand, when the second rail 28 reaches a predetermined position after being displaced from the retracted position P1 with respect to the first rail 26 in the first direction D1, the second moving element 58 is guided, and thus tilted by an angle, by a guiding portion 82 of the second feature 60 of the first rail 26 and consequently abuts against a blocking wall 84 of the second feature 60, thereby preventing the second rail 28 from being freely displaced with respect to the first rail 26 in the opposite direction of the first direction D1.

Referring to FIG. 11 to FIG. 14, when the third rail 30 reaches a predetermined position after being displaced from a forwardly extended position E1 with respect to the first rail 26 in the second direction D2 (i.e., the opposite direction of the first direction D1), the second moving element 58 on the second rail 28 is guided, and thus tilted by an angle, by the releasing member 51 of the third rail 30 and therefore no longer abuts against the blocking wall 84 of the second feature 60 of the first rail 26, allowing the second rail 28 to be displaced in the second direction D2 to the retracted position P1 with respect to the first rail 26, as shown in FIG. 4. When the third rail 30 reaches a predetermined position after being displaced with respect to the second rail 28 in the second direction D2, the first projection 75a on the third rail 30 abuts against the second projection 75b on the second rail 28 to facilitate displacement of the second rail 28 from the retracted position P1 with respect to the first rail 26.

In terms of use, the slide rail assembly 24 is mounted on the corresponding front post 22a and the corresponding rear post 22b of the rack 20 as mentioned above. When the blocking member 76 of the slide rail assembly 24 is operated and thereby brought into a blocking state S1, and the second rail 28 reaches the retracted position R1 after being displaced from the forwardly extended position E1 with respect to the first rail 26 in the second direction D2, the rear end 28b of the second rail 28 is blocked by the blocking member 76, as shown in FIG. 4.

Referring to FIG. 15 to FIG. 17, the blocking member 76 of the slide rail assembly 24 can also be operated to exit the blocking state S1. In a preferred embodiment for example, the blocking member 76 has a slot 86 with a border, and a positioning element 88 extends through the slot 86 to connect the blocking member 76 to the first rail 26 so that a force F2 can be applied to the blocking member 76 to bring the blocking member 76 out of the blocking state S1, as shown in FIG. 17, in which the blocking member 76 is no longer in the blocking state S1. More specifically, the blocking portion 78 of the blocking member 76 can be moved out of the hole 74 of the first rail 26 and thus rendered incapable of blocking the second rail 28. Once the blocking member 76 exits the blocking state S1, the second rail 28 can be displaced in the second direction D2 from the retracted position P1 to a rearwardly extended position E2 with respect to the first rail 26. When the second rail 28 is at the rearwardly extended position E2, the rear end 28b of the second rail 28 extends beyond the rear end 26b of the first rail 26.

To sum up, when the second rail 28 of the slide rail assembly 24 reaches the forwardly extended position E1 after displacement with respect to the first rail 26 in the first direction D1, the front end 28a of the second rail 28 extends beyond the corresponding front post 22a of the rack 20 (as well as the front end 26a of the first rail 26), as shown in FIG. 15. When the blocking member 76 is in the blocking state S1, and the second rail 28 reaches the retracted position P1 after displacement from the forwardly extended position E1 with respect to the first rail 26 in the second direction D2, the rear end 28b of the second rail 28 is blocked by the blocking member 76, as shown in FIG. 16. Once the blocking member 76 is moved out of the blocking state S1, and the second rail 28 reaches the rearwardly extended position E2 after displacement from the retracted position P1 with respect to the first rail 26 in the second direction D2, the rear end 28b of the second rail 28 extends beyond the corresponding rear post 22b of the rack 20 (as well as the rear end 26b of the first rail 26), as shown in FIG. 17.

The foregoing configuration allows the slide rail assemblies disclosed herein to be adjusted into bidirectional slide rails according to practical needs. Moreover, the multiple mechanism features (e.g., the simultaneous displacement mechanism 44, the rear positioning mechanism 54, and the front positioning mechanism 62) of the slide rail assemblies help adapt the present invention to different industrial applications.

While the present invention has been disclosed through the preferred embodiments described above, it is understood that those embodiments are not intended to be restrictive of the scope of the invention. The scope of patent protection sought by the applicant is defined by the appended claims.

What is claimed is:

1. A slide rail assembly, comprising:
a first rail;
a second rail, wherein when the second rail reaches a forwardly extended position after displacement with respect to the first rail in a first direction, a front end of the second rail extends beyond a front end of the first rail; and
a blocking member arranged adjacent to a rear end of the first rail, wherein the blocking member is operable to enter or exit a blocking state;
wherein when the blocking member is in the blocking state, and the second rail reaches a retracted position after displacement from the forwardly extended position with respect to the first rail in a second direction, a rear end of the second rail is blocked by the blocking member;
wherein when the blocking member is not in the blocking state, and the second rail reaches a rearwardly extended position after displacement from the retracted position with respect to the first rail in the second direction, the rear end of the second rail extends beyond the rear end of the first rail.

2. The slide rail assembly of claim 1, further comprising a third rail movably connected to the second rail to increase an extension length of the slide rail assembly.

3. The slide rail assembly of claim 1, wherein the first rail includes an upper wall, a lower wall, and a sidewall extending between the upper wall and the lower wall; and the upper wall, the lower wall, and the sidewall jointly define a first channel for receiving the second rail.

4. The slide rail assembly of claim 2, wherein the second rail includes an upper wall, a lower wall, and a sidewall extending between the upper wall and the lower wall; and the upper wall, the lower wall, and the sidewall jointly define a second channel for receiving the third rail.

5. The slide rail assembly of claim 2, further comprising a simultaneous displacement mechanism, wherein the simultaneous displacement mechanism includes a first elastic element, a first moving element, and an engaging element; the first moving element is arranged on the second rail; the first moving element is at an initial position in response to an elastic force generated by the first elastic element; the engaging element is arranged on the third rail and corresponds to a portion of the first moving element; and when the third rail is displaced from the retracted position with respect to the first rail in the first direction, the first moving element on the second rail and the engaging element on the third rail abut against each other to enable simultaneous displacement of the second rail and the third rail.

6. The slide rail assembly of claim 5, wherein the first rail includes a first feature corresponding to another portion of the first moving element of the simultaneous displacement mechanism, and when the third rail reaches a predetermined position after displacement with respect to the first rail in the first direction, the first moving element is guided, and thus displaced, by the first feature such that the first moving element on the second rail and the engaging element on the third rail no longer abut against each other.

7. The slide rail assembly of claim 2, further comprising a rear positioning mechanism, wherein the rear positioning mechanism includes a second elastic element, a second moving element, and a second feature; the second moving element is arranged on the second rail; the second moving element is at an initial position in response to an elastic force generated by the second elastic element; the second feature is arranged on the first rail, corresponds to a portion of the second moving element, and has a guiding portion and a blocking wall; and when the second rail reaches a predetermined position after displacement from the retracted position with respect to the first rail in the first direction, the second moving element is guided, and thus tilted by an angle, by the guiding portion and consequently abuts against the blocking wall such that the second rail is not freely displaceable with respect to the first rail in the second direction.

8. The slide rail assembly of claim 7, wherein the third rail includes a releasing member corresponding to another portion of the second moving element, and when the third rail reaches a predetermined position after displacement with respect to the first rail in the second direction, the second moving element is guided, and thus displaced, by the releasing member and hence no longer abuts against the blocking wall.

9. The slide rail assembly of claim 2, further comprising a first projection arranged on the third rail and a second projection arranged on the second rail and corresponding to the first projection, wherein the first projection and the second projection abut against each other when the third rail reaches a predetermined position after displacement with respect to the second rail in the second direction.

10. The slide rail assembly of claim 1, wherein the first rail has a hole adjacent to the rear end of the first rail, the blocking member includes a blocking portion, the blocking portion of the blocking member is operable to be located in or outside the hole of the first rail, and when located in the hole of the first rail, the blocking portion serves to block the rear end of the second rail.

11. The slide rail assembly of claim 10, wherein the blocking member includes an operating arm connected to the blocking portion.

12. The slide rail assembly of claim 2, further comprising a front positioning mechanism, wherein the front positioning mechanism includes an operating member having a first blocking section and also includes a second blocking section provided on the first rail; the operating member is movably arranged adjacent to a front end of the third rail; when the third rail is at the retracted position with respect to the first rail, the first blocking section of the operating member and the second blocking section on the first rail abut against each other to prevent the third rail from displacement with respect to the first rail in the first direction; and once the operating member is so operated and displaced that the first blocking section of the operating member and the second blocking section on the first rail no longer abut against each other, the third rail is displaceable with respect to the first rail in the first direction.

13. The slide rail assembly of claim 12, further comprising a connecting spring for applying an elastic force to the operating member, wherein the operating member stays at an initial position in response to an elastic force of the connecting spring, thus keeping the first blocking section and the second blocking section abutting against each other when the third rail is at the retracted position with respect to the first rail.

14. The slide rail assembly of claim 13, wherein the operating member is pivotally connected to the third rail.

15. The slide rail assembly of claim 13, wherein the operating member includes a handle extending beyond the front end of the second rail.

16. A rack system, comprising:
 a rack including a front post and a rear post; and
 a slide rail assembly mounted on the front post and the rear post of the rack, wherein the slide rail assembly includes:
  a first rail;
  a second rail, wherein when the second rail reaches a forwardly extended position after displacement with respect to the first rail in a first direction, a front end of the second rail extends beyond the front post of the rack; and
  a blocking member arranged adjacent to a rear end of the first rail, wherein the blocking member is operable to enter or exit a blocking state;
 wherein when the blocking member is in the blocking state, and the second rail reaches a retracted position after displacement from the forwardly extended position with respect to the first rail in a second direction, a rear end of the second rail is blocked by the blocking member;
 wherein when the blocking member is not in the blocking state, and the second rail reaches a rearwardly extended position after displacement from the retracted position with respect to the first rail in the second direction, the rear end of the second rail extends beyond the rear post of the rack.

17. The rack system of claim 16, wherein the slide rail assembly includes a third rail movably connected to the second rail.

18. The rack system of claim 17, wherein the slide rail assembly includes a simultaneous displacement mechanism; the simultaneous displacement mechanism includes a first elastic element, a first moving element, and an engaging element; the first moving element is arranged on the second rail; the first moving element is at an initial position in response to an elastic force generated by the first elastic element; the engaging element is arranged on the third rail and corresponds to the first moving element; and when the third rail is displaced from the retracted position with respect to the first rail in the first direction, the first moving element on the second rail and the engaging element on the third rail abut against each other to enable simultaneous displacement of the second rail and the third rail.

19. The rack system of claim 17, wherein the slide rail assembly includes a rear positioning mechanism; the rear positioning mechanism includes a second elastic element, a second moving element, and a second feature; the second moving element is arranged on the second rail; the second moving element is at an initial position in response to an elastic force generated by the second elastic element; the second feature is arranged on the first rail, corresponds to the second moving element, and has a guiding portion and a blocking wall; and when the second rail reaches a predetermined position after displacement from the retracted position with respect to the first rail in the first direction, the second moving element is guided, and thus tilted by an angle, by the guiding portion and consequently abuts against the blocking wall such that the second rail is not freely displaceable with respect to the first rail in the second direction.

20. The rack system of claim 17, wherein the slide rail assembly includes a front positioning mechanism; the front positioning mechanism includes an operating member having a first blocking section and also includes a second blocking section provided on the first rail; the operating member is movably arranged adjacent to a front end of the third rail; when the third rail is at the retracted position with respect to the first rail, the first blocking section of the operating member and the second blocking section on the first rail abut against each other to prevent the third rail from displacement with respect to the first rail in the first direction; and when the operating member is so operated and displaced that the first blocking section of the operating member and the second blocking section on the first rail no longer abut against each other, the third rail is displaceable with respect to the first rail in the first direction.

* * * * *